United States Patent
De Marco et al.

(10) Patent No.: US 9,563,730 B2
(45) Date of Patent: Feb. 7, 2017

(54) IMPROVING THE ACCURACY OF AN EXPONENTIAL CURRENT DIGITAL-TO-ANALOG CONVERTER (IDAC) USING A BINARY-WEIGHTED MSB

(71) Applicant: Dialog Semiconductor GmbH, Kirchheim/Teck-Nabern (DE)

(72) Inventors: Louis De Marco, Swindon (GB); Pier Cavallini, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 0 days.

(21) Appl. No.: 14/166,097

(22) Filed: Jan. 28, 2014

(65) Prior Publication Data

US 2015/0214977 A1 Jul. 30, 2015
US 2016/0352352 A9 Dec. 1, 2016

(30) Foreign Application Priority Data

Jan. 14, 2014 (EP) ..................... 14368013

(51) Int. Cl.
H05B 37/02 (2006.01)
G06F 17/50 (2006.01)
H05B 33/08 (2006.01)
H03M 1/74 (2006.01)

(52) U.S. Cl.
CPC ....... *G06F 17/5045* (2013.01); *G06F 17/5063* (2013.01); *H05B 33/0824* (2013.01); *H03M 1/745* (2013.01)

(58) Field of Classification Search
USPC .......................... 315/291, 299; 341/126, 144
See application file for complete search history.

(56) References Cited

U.S. PATENT DOCUMENTS 4,727,355 A * 2/1988 Kohdaka et al. ............. 341/154
7,038,402 B1   5/2006 Adler et al.
7,132,966 B2 * 11/2006 Adler et al. .................. 341/138
(Continued)

FOREIGN PATENT DOCUMENTS

EP    0 780 986    6/1997
EP    1 050 969    11/2000
EP    2 642 823    9/2013

OTHER PUBLICATIONS

European Search Report, 14368013.0-1802, Mailed: Jul. 28, 2014, Dialog Semiconductor GmbH.
(Continued)

*Primary Examiner* — Thuy Vinh Tran
(74) *Attorney, Agent, or Firm* — Saile Ackerman LLC; Stephen B. Ackerman (57) ABSTRACT

An apparatus of an exponential current digital-to-analog converter (IDAC) using a binary-weighted MSB to efficiently drive current controlled light emitting diode (LED) devices. The apparatus comprises of an exponential current digital-to-analog converter (IDAC) current source, a voltage buffer to create an active cascode at the output stage, and an error amplifier that by means of a DC-DC converter voltage loop imposes an appropriate voltage at the output of the IDAC, depending on the current load set to drive the LEDs. The definition of the apparatus involves defining an exponential LSB and exponential MSB current mirrors according to a defined methodology.

10 Claims, 4 Drawing Sheets

(56) References Cited

U.S. PATENT DOCUMENTS

| | | |
|---|---|---|
| 8,421,659 B2 | 4/2013 | von Staudt |
| 8,624,511 B2* | 1/2014 | Cavallini et al. ............. 315/189 |
| 2009/0080267 A1 | 3/2009 | Bedeschi et al. |
| 2010/0164771 A1* | 7/2010 | Mateman ..................... 341/135 |
| 2011/0057825 A1 | 3/2011 | Marraccini et al. |

OTHER PUBLICATIONS

Co-pending U.S. Appl. No. 14/166,035, filed Jan. 28, 2014, "Methods for Improving the Accuracy of an Exponential Current Digital-to-Analog (IDAC) Using a Binary-Weighted MSB," by Louis De Marco et al., 26 pgs.

* cited by examiner

IMPROVING THE ACCURACY OF AN EXPONENTIAL CURRENT DIGITAL-TO-ANALOG CONVERTER (IDAC) USING A BINARY-WEIGHTED MSB

RELATED PATENT APPLICATION

This application is related to Ser. No. 14/166,035, filed on Jan. 28, 2014, owned by a common assignee, and which is herein incorporated by reference in its entirety.

BACKGROUND

Field

The disclosure relates generally to a current digital-to-analog converter circuit, and, more particularly, an apparatus of an exponential current digital-to-analog converter (IDAC) using a binary-weighted MSB to efficiently drive current controlled light emitting diode (LED) devices. The definition of the apparatus involves defining an exponential LSB and exponential MSB current mirrors according to a defined methodology for an exponential current digital-to-analog converter (IDAC) having improved accuracy using a binary-weighted most significant bit (MSB) and a method thereof.

Description of the Related Art

Light emitting diode (LED) device brightness control is achieved by controlling the current that passes through the LED device. In order to dim LED device with less power dissipation than current control, a method of power control is used known as pulse width modulation (PWM). By varying the average current across the LED device, the device can be made to appear dimmer, or brighter. The brightness of current controlled light emitting sources is substantially proportional to the current flowing in them. Because of this characteristic, a digital-to-analog current converter (IDAC) is commonly used to control the brightness of visual displays.

Using a sole linear current digital-to-analog solution has the disadvantage of being perceived by human visual perception as a non-linear dimming process. Therefore a current source that is exponentially related to digital inputs, such as an exponential IDAC, is needed to maintain uniformity in changes to the level of the display brightness.

It is a common practice, the IDAC exponential characteristic is separated into a least significant bit (LSB) and most significant bit (MSB) parts as necessary to contain the circuit complexity and reduce the silicon area. The LSB generates an exponential current with a $DNL_{LSB}$ and so does the MSB with a $DNL_{MSB}$ As discussed in published U.S. Pat. No. 7,132,966 to Adler et al., a circuit to convert a floating point number into an analog current is discussed. The conversion is performed directly by using an exponential current digital-to-analog converter (e.g. exponential IDAC) and a cascaded linear current digital-to-analog converter (e.g. linear DAC).

As discussed in published U.S. Pat. No. 7,038,402 to Adler et al., a circuit to achieve linear and exponential control over current to drive color LEDs is shown. A method for convert floating point number into an analog current is discussed. The conversion is performed directly by using an exponential current digital-to-analog converter (e.g. exponential IDAC) and a cascaded linear current digital-to-analog converter (e.g. linear DAC) to drive color LEDS, and preferably red, green, blue (RGB) LEDs.

As discussed in published U.S. Pat. No. 8,421,659 to von Staudt et al., discloses circuits using a digital-to-analog converter (DAC) controlled by a state machine to produce an analog output that is within a least significant bit (LSB) of a digital input bits. Trim solutions are proposed for major transitions of the digital bits.

As discussed in published U.S. Patent Application US 2011/0057825 to Marraccini et al., discloses systems to achieve logarithmic digital-to-analog converter (DAC). The logarithmic DAC is a linear DAC whose output voltage is converted into a logarithmic current value directly from an I-V characteristics of a diode element. The patent application utilizes a diode in the network to establish the voltage-current transformation.

Figure 1:
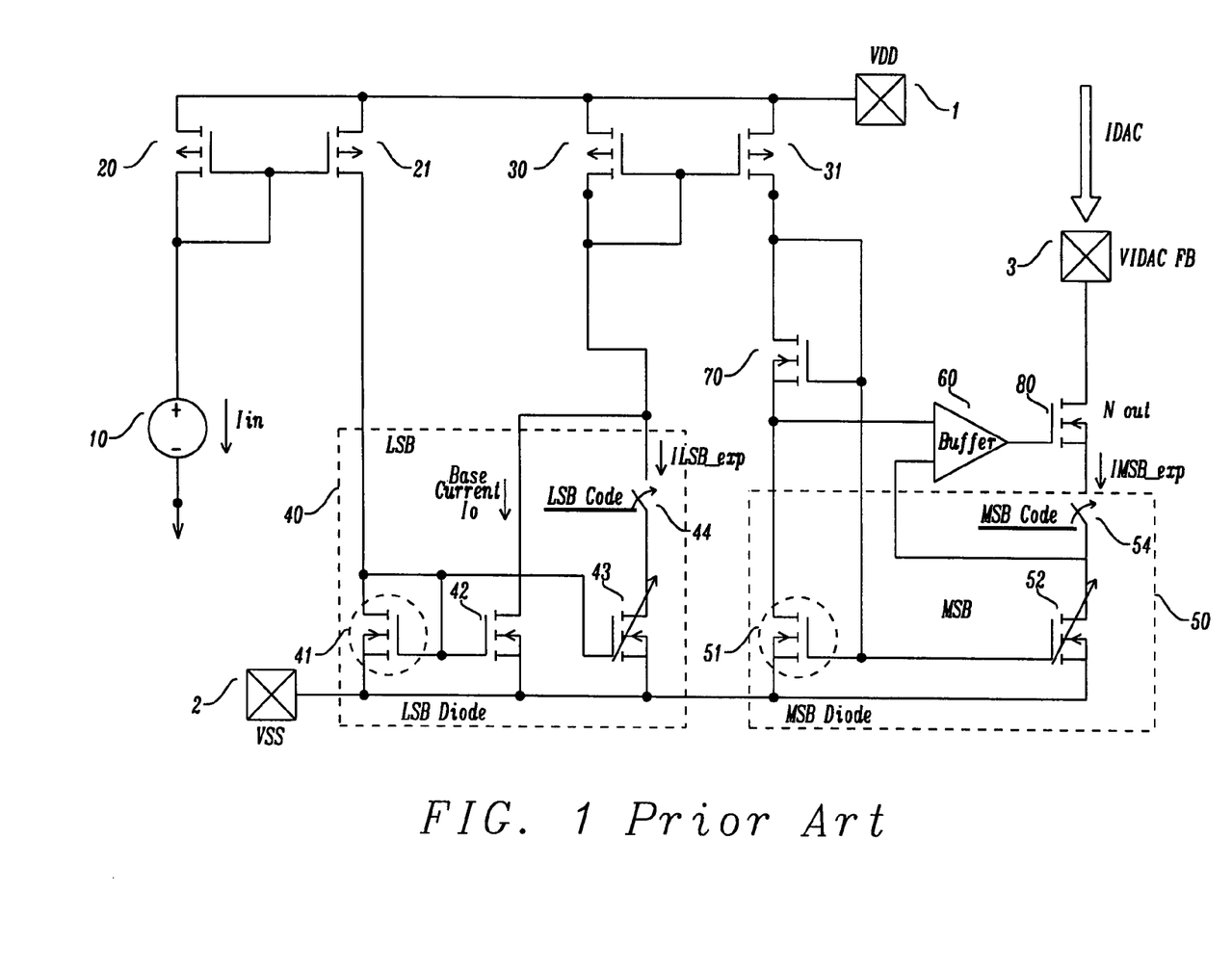
FIG. 1 is a circuit schematic diagram illustrating a prior art embodiment of a IDAC architecture.

As illustrated in FIG. 1, an IDAC architecture is shown. In the implementation of FIG. 1, there is a LSB network that separates the LSB base current Io and the exponential part ILSB_exp. In the implementation of FIG. 1, there is a MSB network that separates the MSB base current To and the exponential part IMSB_exp. FIG. 1 shows a power pad VDD 1, a ground rail VSS 2, a VIDAC_FB pad 3, a first PFET current mirror (20 and 21), a second PFET current mirror (30 and 31), a LSB network 40, and a MSB network 50, a buffer element 60, a transistor 70, and output transistor 80. The LSB network 40 contains a LSB diode 41, a transistor 42 for the base current Io, a variable transistor 43 for the exponent term ILSB_exp, and a LSB responsive switch 44. The MSB network 50 contains a MSB diode 51, a variable transistor 52 for the exponent term ILSB_exp, and a MSB responsive switch 54. Implementing equation for low differential non-linearity (DNL) values using one LSB-diode is feasible task to undertake, considering that at the first part of the characteristic is at relatively low currents and the exponential characteristic is easily approximated with a linear function plus correction terms. But, the difficulty is in the defining of the MSB. Implementing an equation becomes quite tricky if $DNL_{MSB}$ is an irrational number, because that means synthesizing and implementing an MSB current mirror at high currents with an irrational gain. The only way to approximate an irrational gain is to implement several diodes with different gains within the MSB. Systematic error will occur in the overall IDAC DNL. Furthermore, matching between the different branches to contribute to the $DNL_{MSB}$ will be not achievable due to the different plurality of elements of different sizes (e.g. diode elements). These design challenges can easily turn a low DNL exponential IDAC into a high complexity, unmanageable design. In the attempt to simplify matters and to contain the expense of silicon area, a technique called "dithering" is being commonly used. This consists in targeting the design for higher differential non-linearity (DNL) for then getting lower DNL by switching the digital input between two consecutive codes, using an appropriate frequency and duty cycle. The dithering usually creates more issues than it was meant to solve, as it requires good dynamic performance by a structure that is inherently slow, being made of several big current mirrors. Furthermore, it doesn't resolve the problem of having an irrational MSB gain, and so a low DNL accuracy, if a proper architecture wasn't chosen in the first place.

Figure 2:
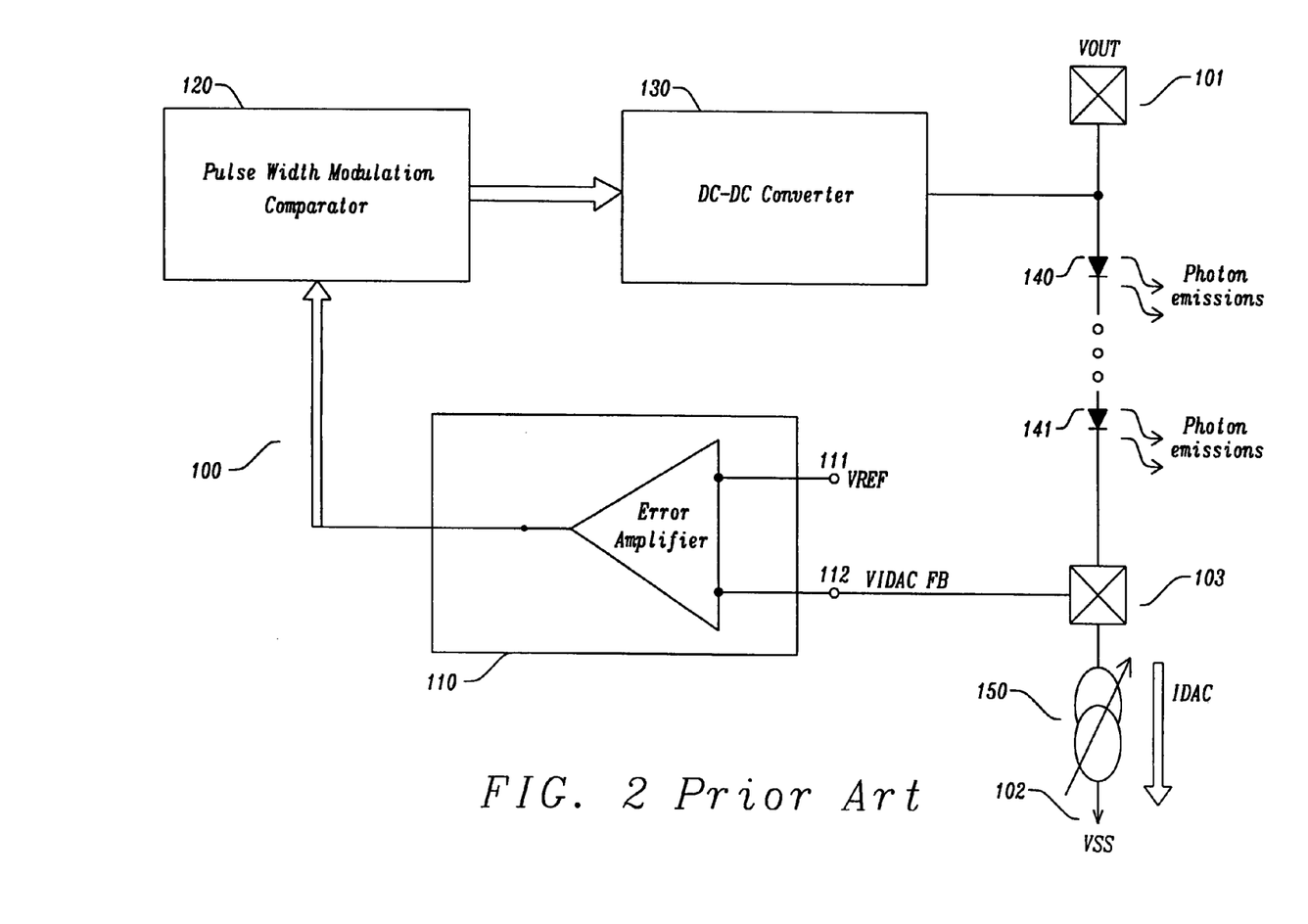
FIG. 2 is a circuit schematic diagram illustrating a prior art embodiment of a system for driving light emitting diode (LED) elements.

As illustrated in FIG. 2, a high level diagram of a system to drive light emitting diode (LED) devices is shown. The block diagram shows a system 100, to drive a string of LED elements. The system contains a power output pad 101, a ground connection 102, an output bondpad 103, a error amplifier 110, a pulse width modulation (PWM) comparator 120, a DC-DC converter 130, a series configured LED elements 140 to 141, a current source 150. The PWM used in the PWM comparator is not to be confused with the PWM used for dimming LEDs as noted in the prior discussion and description of FIG. 1. The IDAC that provides current control for the LEDs used in portable displays needs to be low voltage compliance to reduce the system power loss, so vital for the battery life. The lower the system is able to regulate the node VIDAC_FB the better the efficiency of the system. In the architecture shown in FIG. 1, the operating point of the MSB stage is set by the MSB diode branch, so if VIDAC_FB goes below the drain voltage saturation, VDsat, of the MSB diode device (referred to as IDAC voltage compliance) the current accuracy will be heavily affected. The IDAC voltage compliance (VDsat) is inversely proportional to the size of the MSB output devices. This means that to get good efficiency performance in driving the LEDs, area must be spent in designing the MSB. If the MSB is already large and complex to meet the DNL specification, it will be very difficult to meet the low voltage compliance requirement as well, which is inversely proportional to the MSB devices size. Also considering that different branches with different diodes, so different VDsat, are involved in generating the final output current. So it might not be possible to simply increase the MSB size to push the output voltage VOUT further down without squeezing some current branches. The voltage drop from the transistor NOUT also impacts the system efficiency. The system efficiency can be written as $$\eta = \frac{P_{OUT}}{P_{IN}}$$

where $P_{OUT}$ is the output power, and $P_{IN}$ is the input power. The output power can be defined as a function of IDAC, as follows:

$$P_{OUT} = (V_{out} - VIDAC\_FB) * IDAC$$

To maximize the efficiency is mandatory to reduce the loss in the system. The first visible loss affecting the efficiency of the system is the voltage VIDAC_FB required to obtain the desired current. It's evident that current accuracy and efficiency are in contrast, as to get better efficiency we need to push VIDAC_FB down as much as possible but if we go further down than VDsat we will lose current accuracy.

In these prior art embodiments, the solution to design a low differential non-linearity (DNL) and low voltage compliant exponential digital-to-analog converter (IDAC) that minimizes architectural complexity and mismatch variations is not achieved.

SUMMARY

It is an object of the invention to provide a circuit with an output stage architecture that provides flexibility to work at very low compliant voltages without losing current accuracy.

It is an object of the invention to provide a circuit that obtains a simple low size MSB solution that allows to obtain a low voltage compliant IDAC to reduce the power loss.

A principal object of the present disclosure is to provide a system using an exponential IDAC to drive current-controlled light emitting diodes with improved system efficiency.

A principal object of the present disclosure is to provide a circuit with an output stage architecture that provides flexibility to work at very low compliant voltages without losing current accuracy.

Another further object of the present disclosure is to provide a method to obtain a simple low size MSB solution that allows to obtain a low voltage compliant IDAC to reduce the power loss.

This is achieved using defining an apparatus for driving light emitting diode (LED) elements comprising of an error amplifier, a pulse width modulation comparator electrically connected the output of said error amplifier, a DC-DC converter electrically connected to the output of said pulse width modulation comparator and an output pad, at least one light emitting diode (LED) electrically connected to the input of said error amplifier, and an exponential current digital-to-analog converter (IDAC) using a binary weighted most significant bit (MSB) electrically connected to said cathode of said light emitting diode (LED) and input of said error amplifier wherein said binary weighted MSB is defined according to a specified relationship for IMSB providing an MSB code for the MSB network initiating the MSB switches.

This is further achieved using an apparatus of an exponential current digital-to-analog converter (IDAC) using a binary weighted most significant bit (MSB) comprising of a current source Iin, a buffer element, a first PFET current mirror, a second PFET current mirror, a LSB network, and a binary-weighted MSB network.

This is further achieved by defining a method of exponential current digital-to-analog converter (IDAC) using a binary weighted most significant bit (MSB) wherein a most significant bit (MSB) current mirror comprising the steps of (1) defining a differential non-linearity (DNL), (2) defining number of LSB bits needed for the targeted DNL with a binary weighted MSB, (3) calculating the number of bits to be used for the binary-weighted MSB to get the desired IDAC base, (4) deriving the minimum current for the Imax, (5) defining the LSB as an exponential current mirror according to the specified relationship for the ILSB, and (6) defining a binary weighted MSB according to the specified relationship for IMSB.

A method of design synthesis of an exponential current digital-to-analog converter (IDAC) having improved accuracy using a LSB exponential IDAC and an binary-weighted most significant bit (MSB) exponential IDAC whose method of design synthesis comprising the steps of (1) defining a differential non-linearity (DNL), (2) defining number of LSB bits needed for the targeted DNL with a binary weighted MSB, (3) calculating the number of bits to be used for the binary-weighted MSB to get the desired IDAC base, (4) deriving the minimum current for the Imax, (5) defining the LSB as an exponential current mirror according to the specified relationship for the ILSB, (6) defining a binary weighted MSB according to the specified relationship for IMSB, (7) synthesizing said LSB exponential IDAC, (8) synthesizing said binary-weighted most significant bit (MSB) exponential IDAC, (9) integrating said LSB exponential IDAC and said binary-weighted most significant bit (MSB) exponential IDAC, and (10) optimize said exponential current digital-to-analog converter (IDAC).

These and other objects are achieved by a circuit to achieve an exponential current digital-to-analog converter (IDAC) having improved accuracy using a binary-weighted most significant bit (MSB). As such, an apparatus of an exponential current digital-to-analog converter (IDAC) to efficiently drive current controlled light emitting diode (LED) devices is desired. Other advantages will be recognized by those of ordinary skill in the art.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which.

DETAILED DESCRIPTION

FIG. 1 is a circuit schematic diagram illustrating a prior art embodiment of an IDAC architecture in accordance with a prior art embodiment. In the implementation of FIG. 1, there is a LSB network that separates the LSB base current Io and the exponential part ILSB_exp. In the implementation of FIG. 1, there is a MSB network that separates the MSB base current Io and the exponential part IMSB_exp. FIG. 1 shows a power pad VDD 1, a ground rail VSS 2, a VIDAC_FB pad 3, a first PFET current mirror (20 and 21), a second PFET current mirror (30 and 31), a LSB network 40, and a MSB network 50, a buffer element 60, a transistor 70, and output transistor 80. The LSB network 40 contains a LSB diode 41, a transistor 42 for the base current Io, a variable transistor 43 for the exponent term ILSB_exp, and a LSB responsive switch 44. The MSB network 50 contains a MSB diode 51, a variable transistor 52 for the exponent term ILSB_exp, and a MSB responsive switch 54.

FIG. 2 is a circuit schematic diagram illustrating a prior art embodiment of a system for driving light emitting diode (LED) elements in accordance with prior art. As illustrated in FIG. 2, a high level diagram of a system to drive light emitting diode (LED) devices is shown. The block diagram shows a system 100, to drive a string of LED elements. The system contains a power output pad 101, a ground connection 102, a error amplifier 110, a pulse width modulation (PWM) comparator 120, a DC-DC converter 130, a series configured LED elements 140 to 141, a current source 150. The PWM used in the PWM comparator is not to be confused with the PWM used for dimming LEDs as noted in the prior discussion and description of FIG. 1.

Figure 3:
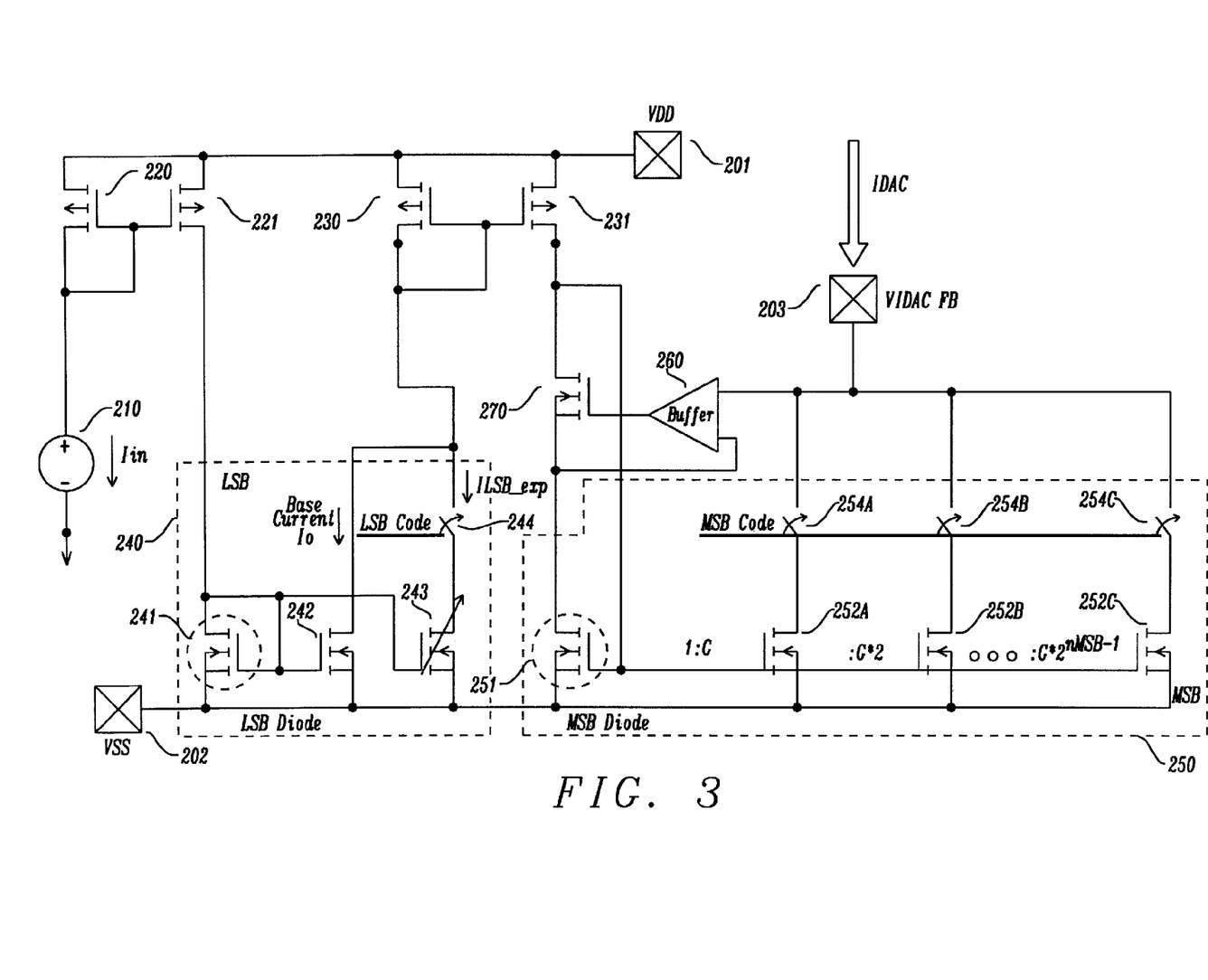
FIG. 3 is a circuit schematic diagram illustrating an exponential current digital-to-analog converter (IDAC) in accordance with one embodiment of the disclosure.

In the preferred embodiment, FIG. 3 is a circuit schematic diagram illustrating an exponential current digital-to-analog converter (IDAC) in accordance with one embodiment of the disclosure. In the implementation of FIG. 3, there is a LSB network that separates the LSB base current Io and the exponential part ILSB_exp. In the implementation of FIG. 3, there is a MSB network that separates the MSB base current Io and the exponential part IMSB_exp.

As illustrated in FIG. 3, shows a power pad VDD 201, a ground rail VSS 202, a VIDAC_FB pad 203, a current source Iin 210, a first PFET current mirror (220 and 221), a second PFET current mirror (230 and 231), a LSB network 240, a MSB network 250, a buffer element 260, and a transistor 270.

The LSB network 240 contains a LSB diode 241, a transistor 242 for the base current Io, a variable transistor 243 for the exponent term ILSB_exp, and a LSB responsive switch 244. The LSB network 240 has the gate of the transistor elements 241, 242, and 243 electrically connected to the drain of p-type current mirror transistor 221. The LSB diode 241 drain is connected to the drain of p-type current mirror transistor 221. The LSB transistor 242 drain is electrically connected to the p-type transistor drain 230 of the p-type current mirror formed from transistor 230 and 231. The drain of LSB transistor 243 is electrically connected to the LSB switch 244. The LSB switch is in series between the drain of LSB transistor 243 and the drain of p-type current mirror transistor 230. The LSB code initiates LSB switch 244.

The MSB network 250 contains a MSB diode 251, and a plurality of transistor elements and series switch elements. The plurality of transistor and series switch elements are illustrated as transistor 252A, and series switch 254A; transistor 252B, and series switch 254B; transistor 252C, and series switch 254C. The MSB code initiates the parallel switches for the MSB switch 254A, 254B, and 254C, as illustrated. The MSB diode 251 element is electrically connected to the transistor 270 and buffer input 260. The gates of the MSB diode 251, and transistors 252A, 252B, and 252C is electrically connected to the p-type current mirror element 231 from current mirror formed from transistors 230 and 231.

The apparatus of the IDAC in FIG. 3, follows the formulation as shown:

$$IDAC = I_0(\text{base})^{\frac{code}{2^n-1}} - ILSB * MSB$$

where
  $I_0$=pedestal current,
  n=number of bits,
and, $$\text{base} = \text{contrast} = \frac{I_{max}}{I_0}$$

$$ILSB = \frac{I_0}{G}(\text{base})^{\frac{LSB_{code}}{2^n-1}}$$

$$MSB = G(\text{base})^{\frac{X*MSB_{code}}{2^n-1}}$$

$$n = nLSB + nMSB$$

where LSBcode=(0 . . . nLSB) and MSBcode=(0, . . . , nMSB).

The variable, G, is the current gain between LSB and MSB, and X is chosen appropriately.

$$\frac{(2^{nLSB}-1) + X*(2^{nMSB}-1)}{(2^n-1)} - 1 \rightarrow X = 2^{nLSB}$$

The differential non-linearity (DNL) is typically defined as the current step percentage, $$DNL\% = \frac{IDAC(n+1) - IDAC(n)}{IDAC(n)} * 100$$

In this embodiment, the DNL will be defined as the ratio of two consecutive steps, or as a percentage, as shown below, $$DNL = \frac{IDAC(n+1)}{IDAC(n)}$$

or $$DNL = 1 + \frac{DNL\,\%}{100}$$

As such, it is possible to represent the DNL as follows:

$$DNL = \frac{IDAC(n+1)}{IDAC(n)} = (\text{base})^{\frac{1}{2^n-1}} = DNL_{LSB}$$

The exponential IDAC network can be defined as a function of the LSB, the DNL, the nLSB, and MSBcode. The relationship for the implementation can be defined according to the following derivation $$MSB = G * \left[(DNL)^{2^{nLSB}}\right]^{MSBcode}$$
$$DNL_{MSB} = (DNL)^{2^{nLSB}}$$

The design synthesis of the exponential IDAC circuit is then defined by forming two exponential current mirror networks from the derivations, where one of the current source networks is for the least significant bit (LSB), and a second for the most significant bit (MSB), as illustrated in FIG. 3.

The current through the LSB, the ILSB, can be defined as a function of the linear current Io, the gain parameter G, the DNL, and the LSBcode.

$$ILSB = \frac{I_0}{G} * (DNL)^{LSBcode}$$

The current through the MSB, the IMSB, can be defined as a function of the gain parameter G, the ILSB, the DNL of the MSB, and the MSBcode.

$$IMSB = G * ILSB * (DNL_{MSB})^{MSBcode}$$

Defining the number of bits needed for the LSB to achieve $DNL_{MSB} = 2$.

$$2 = (DNL)^{2^{nLSB}}$$

The base required for the synthesis of a design of an exponential IDAC with a binary-weighted MSB, will determine the number of MSB bits that are required.

$$\text{base} = \frac{(2)^{2^{nMSB}}}{DNL}$$

Defining a differential non-linearity (DNL) according to the definition $$DNL = 1 + \frac{DNL\,\%}{100}$$

Defining number of LSB bits needed for the targeted DNL with a binary weighted MSB $$DNL_{MSB} = (DNL)^{2^{nLSB}}$$

Calculating the IDAC base using the number of bits used for the MSB $$\text{base} = \frac{(2)^{2^{nMSB}}}{DNL}$$

Deriving the minimum current for the Imax $$Io = Imax/\text{base}$$

Defining the LSB as an exponential current mirror according to the specified relationship for the ILSB $$ILSB = \frac{I_0}{G} * (DNL)^{LSBcode}$$

For LSB code=0, . . . n LSB
Defining a binary weighted MSB according to the specified relationship for IMSB, $$IMSB = G * ILSB * (DNL_{MSB})^{MSBcode}$$

For MSB code=0, . . . n MSB.

As an example of the preferred embodiment of FIG. 3, considering that, according to definition, it is usually DNL about 1, the number of nMSB will depend on how much contrast is needed. Typically, an IDAC to drive a light emitting diode (LED) string, needs a maximum current in the order of 25 mA. To guarantee an appropriate range of dimming you might want to be able to go down to tens of uA as minimum current. This means that, based on equation, nMSB=3 is possible, as illustrated in FIG. 3.

$$\text{base} = \frac{(2)^{2^n}}{DNL} \cong 256 \rightarrow Imin = \frac{25\text{ mA}}{256} \cong 98\text{ uA}$$

Note that the formulas described are also applicable to the architecture of FIG. 1, as well as the architecture that employs an LSB and MSB current mirror to generate an exponential current.

FIG. 3 is an example embodiment associated with the methodology defined in the disclosure to create an exponential IDAC with a 3-bits binary-weighted MSB. It is possible to design an exponential IDAC with a 3-bits binary-weighted MSB, which will be easy to layout, more accurate and simple enough to allow spending area to meet the low voltage compliance specification.

As such, an exponential current digital-to-analog converter (IDAC) circuit, and, more particularly, an apparatus of an exponential current digital-to-analog converter (IDAC) using a binary-weighted MSB to efficiently drive current controlled light emitting diode (LED) devices are herein described. The apparatus comprises of a exponential current digital-to-analog converter (IDAC) current source, a voltage buffer to create an active cascode at the output stage, and an error amplifier that by means of a DC-DC converter voltage loop imposes an appropriate voltage at the output of the IDAC, depending on the current load set to drive the LEDs. The definition of the apparatus involves defining an exponential LSB and exponential MSB current mirrors according to a defined methodology. The improvement is achieved providing a solution for low voltage compliance without losing current accuracy. The improvement allows for an output stage that allows flexibility for the IDAC to be operable in both saturation and linear region, as well as allow for improved efficiency.

Figure 4:
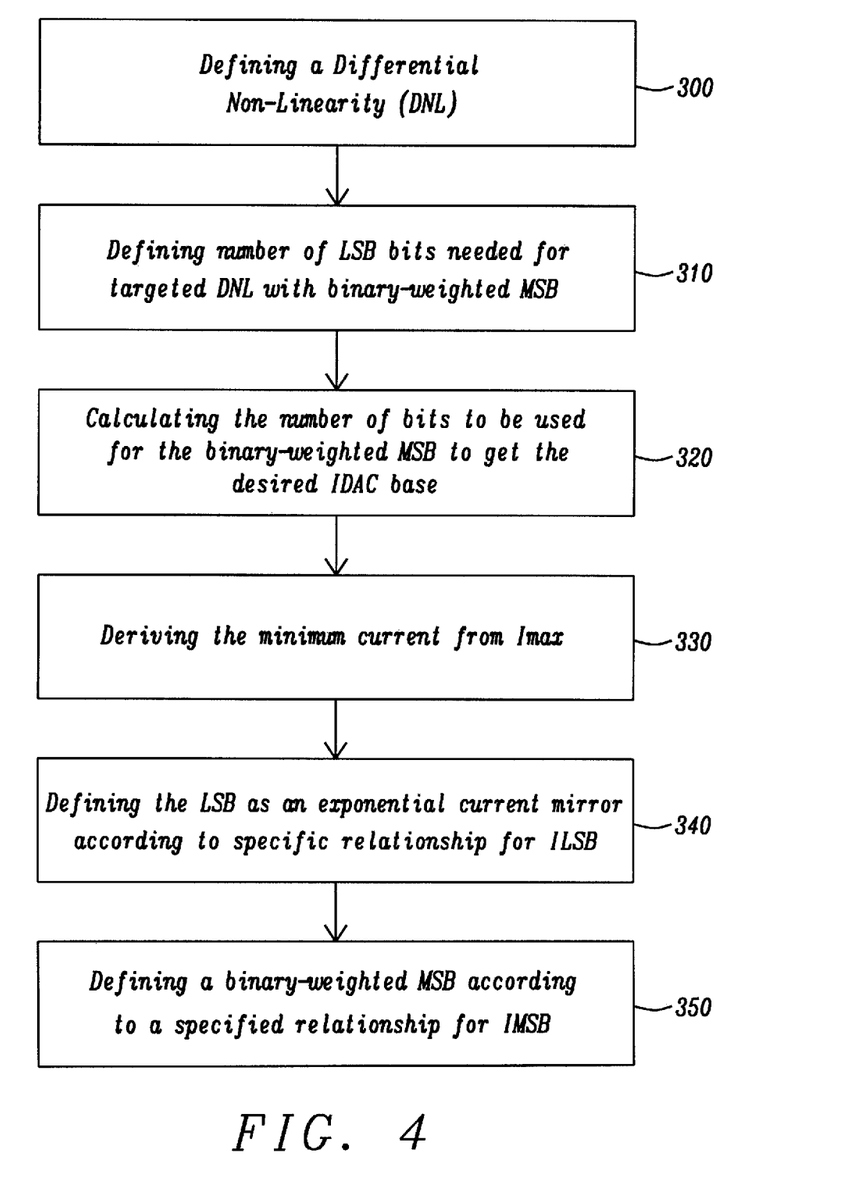
FIG. 4 is a method for defining an exponential current digital-to-analog converter (IDAC).

FIG. 4 is a high level diagram for the method of design synthesis for improving the accuracy of an exponential IDAC using a binary weighted MSB in accordance with one embodiment of the disclosure. A method to achieve an exponential current digital-to-analog converter (IDAC) having improved accuracy using a binary-weighted most significant bit (MSB) comprising:

defining a differential non-linearity (DNL);
defining number of LSB bits needed for the targeted DNL with a binary weighted MSB;
calculating the number of bits to be used for the binary-weighted MSB to get the desired IDAC base;
deriving the minimum current for the Imax;
defining the LSB as an exponential current mirror according to the specified relationship for the ILSB; and
defining a binary weighted MSB according to the specified relationship for IMSB.

As the first step 300, a differential non-linearity (DNL) is defined. The second step 310 defines the number of LSB bits needed for the targeted DNL with a binary weighted MSB. The third step 320 calculates the number of bits for the binary-weighted MSB to get the desired IDAC base. The fourth step 330 derives the minimum current for the Imax. The fifth step 340 defines the LSB as an exponential current mirror according to the specified relationship for the ILSB. The sixth step 350 defines a binary weighted MSB according to the specified relationship for IMSB.

As such, a method of exponential current digital-to-analog converter (IDAC) using a binary weighted most significant bit (MSB) wherein said most significant bit (MSB) current mirror is defined according the following steps, (1) defining a differential non-linearity (DNL), (2) defining number of LSB bits needed for the targeted DNL with a binary weighted MSB, (3) calculating the number of bits to be used for the binary-weighted MSB to get the desired IDAC base, (4) deriving the minimum current for the Imax, (5) defining the LSB as an exponential current mirror according to the specified relationship for the ILSB, and (6) defining a binary weighted MSB according to the specified relationship for IMSB.

A method of design synthesis to achieve an exponential current digital-to-analog converter (IDAC) having improved accuracy using a LSB exponential IDAC and an binary-weighted most significant bit (MSB) exponential IDAC whose method of design synthesis comprises (1) defining a differential non-linearity (DNL), (2) defining number of LSB bits needed for the targeted DNL with a binary weighted MSB, (3) calculating the number of bits used for the binary-weighted MSB to get the desired IDAC base, (4) deriving the minimum current for the Imax,
(5) defining the LSB as an exponential current mirror according to the specified relationship for the ILSB, (6) defining a binary weighted MSB according to the specified relationship for IMSB, (7) synthesizing the LSB exponential IDAC, (8) synthesizing the binary-weighted most significant bit (MSB) exponential IDAC, (9) integrating the LSB exponential IDAC and the binary-weighted most significant bit (MSB) exponential IDAC, and (10) optimize the exponential current digital-to-analog converter (IDAC).

Other advantages will be recognized by those of ordinary skill in the art. The above detailed description of the disclosure, and the examples described therein, has been presented for the purposes of illustration and description. While the principles of the disclosure have been described above in connection with a specific device, it is to be clearly understood that this description is made only by way of example and not as a limitation on the scope of the disclosure.

What is claimed is:

1. An apparatus for driving light emitting diode (LED) elements comprising:
an error amplifier;
a pulse width modulation comparator electrically connected to an output of said error amplifier;
a DC-DC converter electrically connected to an output of said pulse width modulation comparator and an output pad;
at least one light emitting diode (LED) electrically connected to an input of said error amplifier and to an output of a most significant bit (MSB) network;
an output buffer having inputs and an output, wherein a first input is connected to the output of the MSB network and a second input is connected to a drain of a MSB diode element and to a source of a control transistor and the output of the output buffer is connected to a gate of the control transistor, wherein the output buffer creates an active cascode at an output of the MSB network, which is also an output stage of an exponential current digital-to-analog converter (IDAC), wherein a current through the control transistor is proportional to an output current of the MSB network flowing through the at least one LED;
said control transistor having its drain connected to a drain of a first p-type transistor of a first current mirror, wherein the gate of the first p-type transistor is connected to the gate of a second p-type transistor, and the first current mirror is formed of the first and second p-type transistors wherein the sources of both transistors of the first current mirror are connected to VDD voltage and the drain of the second p-type transistor is connected to an output current of a least significant bit (LSB) network network;
wherein the IDAC comprises a least significant bit exponential current IDAC (LSBIDAC) comprising the LSB network and a binary weighted most significant bit exponential current IDAC (MSBIDAC) comprising the MSB network, wherein a desired value of the IDAC output current is set by a digital word whose first n bits form the most significant part (MSB code) and whose last bits form the least significant bit part (LSB code), wherein said binary weighted most significant bit (MSBIDAC) is electrically connected to said cathode of said light emitting diode (LED) and to an input of said error amplifier;
wherein said MSB network comprises:
said MSB diode element having its source connected to a voltage source and its gate to gates of a multitude of MSB current mirror transistors;
said multitude of the MSB current mirror transistors, having their sources connected to the voltage source and each drain of the current mirror transistors is connected to a first terminal of an own MSB code switch, wherein the number of the MSB current mirror transistors corresponds to the number of bits in the MSB part of the digital word and wherein the sizes of the MSB current mirror transistors are binary weighted in relation to the size of the MSB diode element depending on a relative position within the MSB part of the digital word according to the equation: size=$1/C \times 2^{MSB\_pos-1}$, wherein the position to find where each MSB current mirror transistor is located in a parallel deployment of transistors in the MSB network, C corresponds to the size of the MSB diode element and MSB$_{pos}$ corresponds to the position of a MSB current mirror transistor related to a position of a correspondent bit of the MSB code; and said MSB code switches, wherein the second terminals of the MSB code switches are all connected to the output of the MSB network, wherein each switch is closed or open according to the value of a correspondent bit of the MSB code, wherein the correspondent bit relates to the position of the correspondent MSB current transistor it is connected to;

wherein the output current of the LSB network is mirrored by the first current mirror, furthermore flowing through the control transistor, which is controlled by the buffer and is then mirrored by the current mirror formed by the MSB diode element and the MSB current mirror transistors to become, dependent on the status of the switches, the output current of the exponential current digital-to-analog converter (IDAC) is driving the LED elements.

2. The apparatus of claim 1, wherein said exponential current digital-to-analog converter (IDAC) using a binary weighted most significant bit (MSB) comprises:
an output pad providing a voltage feedback signal of the exponential current digital-to-analog converter (IDAC).

3. An apparatus of an exponential current digital-to-analog converter (IDAC) using a binary weighted most significant bit (MSB) comprising:
a current source;
a LSB network;
a first PFET current mirror electrically connected to said current source and electrically connected to said LSB network;
a binary weighted MSB network;
a buffer element having inputs and an output, wherein a first input is connected to the output of the MSB network and a second input is connected to a drain of a MSB diode element and to a source of a control transistor and the output of the output buffer is connected to a gate of the control transistor, wherein the output buffer creates an active cascode at an output of the MSB network, which is also an output stage of an exponential current digital-to-analog converter (IDAC), wherein a current through the control transistor is proportional to an output current of the MSB network flowing through the at least one LED;
said MSB diode element having its source connected to a voltage source and its gate to gates of a multitude of MSB current mirror transistors;
said control transistor having its drain connected to a drain of a first p-type transistor of the first PFET current mirror, wherein the gate of the first p-type transistor is connected to the gate of a second p-type transistor of the first PFET current mirror; wherein the sources of both transistors of the first PFET current mirror are connected to VDD voltage and the drain of the second transistor is connected to an output current of the LSB network;
a second PFET current mirror electrically connected to said buffer element and said binary weighted MSB network.

4. The apparatus of an exponential current digital-to-analog converter (IDAC) using a binary weighted most significant bit (MSB) of claim 3, wherein said binary-weighted MSB network comprises of a plurality of transistors and switches.

5. The apparatus of an exponential current digital-to-analog converter (IDAC) using a binary weighted most significant bit (MSB) of claim 4 wherein said binary-weighted MSB network switches are initiated by MSBcode.

6. The apparatus of an exponential current digital-to-analog converter (IDAC) using a binary weighted most significant bit (MSB) of claim 5 wherein said binary-weighted MSB network is configured for:
defining a differential non-linearity (DNL);
defining number of LSB bits needed for the targeted DNL with a binary weighted MSB;
calculating the number of bits to be used for the binary-weighted MSB to get the desired IDAC base;
deriving the minimum current for the a maximum current;
defining the LSB as an exponential current mirror according to the specified relationship for the a current least significant bit (ILSB); and
defining a binary weighted MSB according to the specified relationship for a current most significant bit (IMSB).

7. The apparatus of an exponential current digital-to-analog converter (IDAC) using a binary weighted most significant bit (MSB) of claim 5 wherein said binary-weighted MSB network number of elements is nMSB=3.

8. A method of operating an exponential current digital-to-analog converter (IDAC) using a binary weighted most significant bit (MSB) with a most significant bit (MSB) current mirror comprising the steps of:
defining a differential non-linearity (DNL);
defining a number of LSB bits needed for a targeted DNL with a binary weighted MSB;
calculating the number of bits to be used for the binary-weighted MSB to get a desired IDAC base;
deriving a minimum current for the maximum current;
defining the LSB as an exponential current mirror according to a relationship for the a current through a least significant bit (LSB) network (ILSB; and
defining a binary weighted MSB according to a relationship for a current through a most significant bit (MSB) network (IMSB.

9. The method of claim 8 wherein said defining binary weighted MSB according to the relationship for IMSB comprises, $$IMSB = G*ILSB*(DNL_{MSB})^{MSBcode}$$

for MSB code=0, . . . n; wherein n is an integer, G is the current gain between LSB and MSB, DNL$_{MSB}$ is differential non-linearity of MSB, and MSB$_{code}$ is a value of a MSB.

10. A method of design synthesis to achieve an exponential current digital-to-analog converter (IDAC) having improved accuracy using a LSB exponential IDAC and a binary-weighted most significant bit (MSB) exponential IDAC; the method of design synthesis comprising the steps of:
defining a differential non-linearity (DNL);
defining a number of LSB bits needed for the targeted DNL with a binary weighted MSB;
calculating the number of bits to be used for the binary-weighted MSB to get a desired IDAC base;
deriving a minimum current for the maximum current;
defining the LSB as an exponential current mirror according to a specified relationship for the ILSB;
defining a binary weighted MSB according to the relationship for IMSB;
synthesizing said LSB exponential IDAC;
synthesizing said binary-weighted most significant bit (MSB) exponential IDAC;

integrating said LSB exponential IDAC and said binary-weighted most significant bit (MSB) exponential IDAC; and optimize said exponential current digital-to-analog converter (IDAC).

* * * * *